(12) United States Patent
Zounes

(10) Patent No.: US 7,084,464 B2
(45) Date of Patent: Aug. 1, 2006

(54) LIBRARY OF CELLS FOR USE IN DESIGNING SETS OF DOMINO LOGIC CIRCUITS IN A STANDARD CELL LIBRARY, OR THE LIKE, AND METHOD FOR USING SAME

(75) Inventor: Thomas David Zounes, Carlsbad, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 40 days.

(21) Appl. No.: 10/604,318

(22) Filed: Jul. 10, 2003

(65) Prior Publication Data
US 2005/0006670 A1 Jan. 13, 2005

(51) Int. Cl.
*H01L 29/76* (2006.01)
(52) U.S. Cl. .............................. 257/368; 716/1; 716/2; 716/7; 716/8; 716/9; 716/10; 716/11; 716/17
(58) Field of Classification Search ................ 257/368; 716/1–2, 7–11, 17
See application file for complete search history.

(56) References Cited

U.S. PATENT DOCUMENTS

| | | | |
|---|---|---|---|
| 5,150,309 A | 9/1992 | Shaw et al. .................. | 364/491 |
| 5,402,012 A | 3/1995 | Thomas ....................... | 326/97 |
| 5,814,846 A | 9/1998 | Essbaum et al. ............ | 257/207 |
| 6,711,720 B1* | 3/2004 | Chen ............................. | 716/2 |
| 6,785,875 B1* | 8/2004 | Beerel et al. .................. | 716/6 |
| 2002/0099989 A1* | 7/2002 | Kawabe et al. ............. | 714/724 |
| 2002/0144223 A1* | 10/2002 | Usami et al. .................. | 716/4 |

* cited by examiner

*Primary Examiner*—Long Pham
(74) *Attorney, Agent, or Firm*—Lisa K. Jorgenson; William J. Kubida (57) ABSTRACT

A cell library for designing integrated domino circuits has a first library portion with a plurality of selectable logic circuits having different transistor sizes and/or logic functions for selection according to desired logic function and parametric characteristics. A second library portion includes a plurality of selectable prechargeable driver circuits. Each of the driver circuits is configured to be connectable to an output of a selected one of the logic circuits. The driver circuits also have at least different transistor sizes. Standard FET devices may be constructed to precharge the output node of the selected logic circuit in the design of a domino logic circuit.

37 Claims, 6 Drawing Sheets

LIBRARY OF CELLS FOR USE IN DESIGNING SETS OF DOMINO LOGIC CIRCUITS IN A STANDARD CELL LIBRARY, OR THE LIKE, AND METHOD FOR USING SAME

BACKGROUND OF INVENTION

1. Field of Invention

This invention relates to improvements in circuit design methods, and more particularly to improvements in domino circuit design methods, and still more particularly to circuit libraries for use in performing such methods.

2. Relevant Background

Recently, circuit designers have been devoting increased interest to CMOS domino logic circuit designs, because of their reduced integrated circuit area, smaller parasitic capacitances, higher speed, and increased reliability.

Typically, domino logic circuits have an NMOS, or pull-down, logic portion, although PMOS pull-up logic circuits have been used in many applications. The logic portion serves to evaluate input logic signals to provide a conditional output signal to an output inverter.

Domino logic circuits also have a precharge transistor, typically a PMOS device when the logic circuit is made up with NMOS transistors, which is switched by the clock signal to connect the "dynamic node" of the circuit to a precharge voltage during a "precharge phase" of the clock cycle. The "dynamic node" may be for example, the output node of the logic circuit or the input node of the associated output inverter.

Thus, typically, the output inverter transistors are precharged during the precharge phase, while the clock signal is in a first state, low, for example, in an NMOS logic circuit implementation, or high in a PMOS logic circuit implementation. During the precharge phase, an "evaluate" transistor, whose gate is also connected to the clock signal, isolates the associated logic circuit from the precharge voltage.

When the particular logic conditions of the logic circuit are met during a subsequent "evaluate" phase when the clock signal transitions from low to high in the NMOS logic circuit implementation, the output node of the logic circuit (the input of the inverter) is pulled down and the output of the inverter is pulled up. If the logic conditions of the logic circuit are not met, the output of the inverter remains low. Because the inverter is precharged when the clock signal transitions from low to high, the cell output can be developed very rapidly.

In the design of domino logic circuits, it will be appreciated that different applications require circuits of different speeds and driving abilities. However, usually a trade-off is involved, since in domino logic applications, usually faster circuits are larger in layout size, and consequently occupy more real estate of the substrate on which the circuit is constructed, and additionally consume more power. On the other hand, if the transistors of the logic circuit are made too large, they may unduly load the driver circuit. Consequently, in some applications, it may be that the driver circuit is large, while the associated logic circuitry is of relatively smaller devices, or vice versa. It can be seen that depending upon the particular application, large numbers of combinations of circuits may be required.

As a result, domino logic circuits had to be individually designed to provide the necessary speed and drive power for a particular application. However, once the drive circuit has been designed, the associated logic circuit also had to be designed in accordance with the parameters of the drive circuit (or vice versa). As can be seen, this design process has been difficult and time consuming.

In efforts to standardize the design process, layout templates have been proposed into which the various domino circuit components can be placed in order to facilitate interconnection of a number of gates in a particular circuit. The arrangement of the various circuit parts in fixed layout regions provides a "standard cell", connectable to similar adjacent regions.

In one proposal, for example, a layout template is suggested for a domino logic circuit of the type having an n-FET logic tree. The n-FET logic tree is inserted into a first portion of the template. The output from the logic circuit is inverted in an output inverter, and latched by a p-FET device connected around the inverter. The p-FET portions of the inverter, a p-FET precharge transistor, and the p-FET latch transistor are inserted in predefined second template locations. The clock also includes an n-FET evaluate transistor, which is inserted into a third template area.

However, in this and other previous proposals, the fixed layout template has not been concerned with the parametric characteristics of the ultimate cells, only the standardization of the layout template into which they are constructed to enable standardization of cell interconnections.

What is needed, therefore, is a method and circuit library for designing domino logic circuits to form a collection of domino logic cells that can be used for particular applications having varying drive power and speed requirements.

SUMMARY OF INVENTION

In light of the above, therefore, it is an object of the invention to provide a method and circuit library from which domino logic cell or gate sets can be constructed for particular applications having varying drive power, speed, or other parametric characteristic requirements.

An advantage of the invention is that sets of matchable circuits, namely, logic and drive circuits, can be selected to develop a library of circuits for a particular application. By "matchable", "match", "matching", or "matched" it is meant herein that the size, speed, capacitance, or other parametric characteristic of the circuits can be appropriately interconnected for a desired result. The term is not intended to imply that the parametric characteristics of the logic and drive circuits are necessary the same, or even substantially the same.

Another advantage of the invention is that a library of domino circuits can be quickly developed, constructed, and completed.

Although layout templates may be used, they are not essential. The various sizes of the final circuits, which may constitute a library of "standard cells", may be fixed or variable, depending upon the particular uses to which the library that is developed is to be used. In some cases, however, the boundary locations of the circuits may be established to readily accommodate interconnection of various circuits that may result from the use of the circuit libraries defined by the invention.

According to a broad aspect of the invention, a set, family, or library of logic circuits is provided from which a desired logic function can be constructed. The transistors in the set have different sizes, speeds, capacitances, loading characteristics, or other parametric characteristics. Each circuit has an associated evaluate or "footer" transistor that is selected with the selection of the circuit. Additionally, a set, family, or library of driver circuits is provided so that a driver can be selected to match the characteristics of the selected n-logic circuit, for example, in respect to sizes, speeds, capacitances, loading characteristics, or other parametric characteristics. A standard PMOS precharge transistor may be constructed, depending upon the characteristics of the circuit components selected from the libraries.

According to another broad aspect of the invention, a cell library is provided for use in designing integrated domino circuits. The cell library includes a first library portion including a plurality of FET logic circuits of first conductivity type to provide at least selectable transistor sizes. A second library portion includes a plurality of selectable prechargeable complementary FET driver circuits. Each of the driver circuits is configured to be connectable to an output of a selected one of the logic circuits, to provide selectable logic functions, transistor sizes, or other parametric characteristic.

According to yet another broad aspect of the invention, a cell library is provided for use in designing integrated circuits. The cell library includes a first library portion containing a plurality of NMOS logic circuits to provide selectable logic functions and transistor sizes. A second library portion contains a plurality of selectable driver circuits, each configured to be connectable to an output of a selected one of the logic circuits. The driver circuits are selectable to match at least a size characteristic of the selected one of the logic circuits.

According to still another broad aspect of the invention, a cell library is provided. The cell library includes a plurality of selectable inverting NMOS logic circuits and a plurality of selectable inverter circuits. The inverter circuits are connectable to receive at least one output from a selected NMOS logic circuit.

According to yet another broad aspect of the invention, a method is presented for constructing an integrated circuit. The method includes selecting a logic circuit from a cell library containing a plurality of logic circuits and selecting a driver circuit from the cell library containing a plurality of driver circuits for connection to the selected logic circuit to match at least a size characteristic of the selected logic circuits.

BRIEF DESCRIPTION OF DRAWINGS

The invention is illustrated in the accompanying drawing, in which.

In the various figures of the drawing, like reference numerals are used to denote like or similar parts.

DETAILED DESCRIPTION

According to a preferred embodiment of the invention, a method and circuit library are provided. The library enables domino logic cell, gate, or circuit sets to be constructed for particular applications having varying drive power, speed, or other parametric characteristic requirements or having varying logic function requirements. Thus, with reference first to FIGS. 1a–d, an exemplar of a logic circuit set that may be included in a logic circuit collection from which domino logic circuits can be constructed is shown. From the logic circuit library of FIGS. 1a–d, a a set or library of circuits can be designed that have desired logic functions and parametric characteristics. In the library of FIGS. 1a–d, the various transistors have different sizes, speeds, capacitances, loading characteristics, or other parametric characteristics, and, as mentioned above, may be of appropriate polarity, i.e., NMOS or PMOS. In the examples herein, NMOS logic circuit functions are shown. The library example shown is abbreviated, showing only a few of the possible circuit configurations that can be presented for selection in the formation of a circuit library for a particular design application.

Figure 1A:
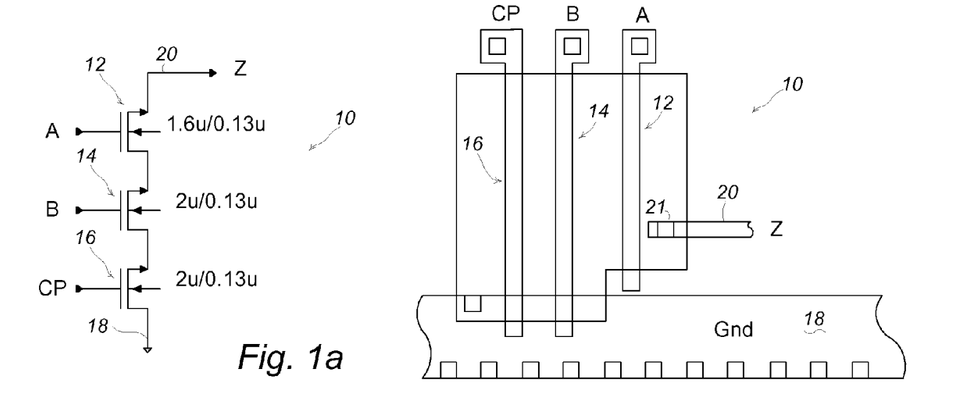
FIGS. 1a–d are circuit and layout diagrams of an example of an abbreviated library set of logic circuits that may be used in the construction of a library of domino circuits, in accordance with a preferred embodiment of the invention.
Figure 1B:
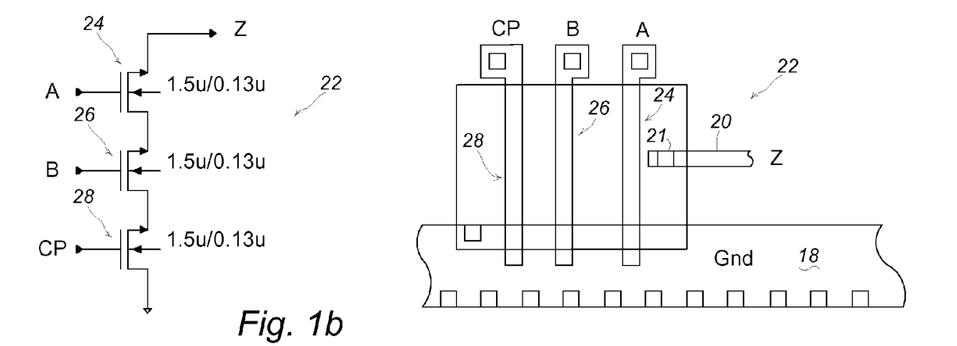
Figure 1C:
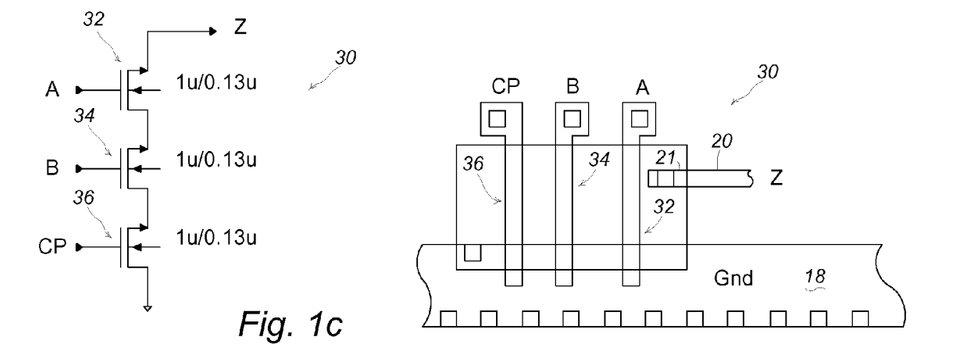

More particularly, the circuits of FIGS. 1a–c show various selectable two-input NAND logic gates, the electrical schematic of which being shown on the left of the drawing and a corresponding representation of the layout of each circuit being shown on the right of the drawing. The layout representations show features that are only of approximate relative size, and show the implant, poly-1, contact, and selected metal-1 layers. Those skilled in the art will recognize the existence of various oxide or isolation layers between the various features shown.

Thus, as an example, the circuit 10 of FIG. 1a of the abbreviated library has three transistors 12, 14, and 16 in series, which can be configured to receive respectively logic inputs A and B and the clock signal, CP, on their respective gates. In the layout diagram, the gate connections are labeled at respective contact features, and the corresponding metal-1 layers have been omitted for clarity. One end of the transistors 12, 14, and 16 is connected to a ground rail 18, and the output, Z, is derived at the other end on line or node 20.

The node 20 is selectively connectable to a driver circuit, described below in detail, and constitutes the dynamic node that will be precharged in the operation of the domino circuit into which the circuit 10 may be incorporated. A typical metal-1 layer is shown connected to the contact 21 of transistor 12 to provide the output line, Z, 20. As can be seen, the transistors 12, 14, and 16 have a width-to-length (W/L) ratio respectively of 1.6 u/0.13 u, 2 u/0.13 u, and 2 u/0.13 u. This results in known transistor characteristics, notably the speed, capacitance, and drive capabilities of the devices, as well as other characteristics.

Similarly, the circuit 22 of FIG. 1b of the abbreviated library has three transistors 24, 26, and 28 in series, which can be configured to receive respectively logic inputs A and B and the clock signal, CP. One end of the transistors 24, 26, and 28 is connected to the ground rail 18 at one end, and the output, Z, is derived at the other end on line or node 20. As can be seen, the transistors 24, 26, and 28 have a width-to-length (W/L) ratio respectively of 1.5 u/0.13 u, 1.5 u/0.13 u, and 1.5 u/0.13 u. This results in known transistor characteristics different from those of the circuit of FIG. 1a.

Moreover, the circuit 30 of FIG. 1c of the abbreviated library has three transistors 32, 34, and 36 in series, which can be configured to receive respectively logic inputs A and B and the clock signal, CP. One end of the transistors 32, 34, and 36 is connected to the ground rail 18 at one end, and the output, Z, is derived at the other end on line or node 20. As can be seen, the transistors 32, 34, and 36 have a width-to-length (W/L) ratio respectively of 1 u/0.13 u, 1 u/0.13 u, and 1 u/0.13 u. This results in known transistor characteristics different from those of the circuits of FIGS. 1a and 1b.

The respective clock transistors 16, 28, and 36 will serve as the "evaluate" or "footer" transistor for the ultimate circuit to be constructed, in the selective matching combination of one of the circuits 10, 22, or 30 with a corresponding driver circuit described below in conjunction with FIGS. 2a–c.

Figure 1D:
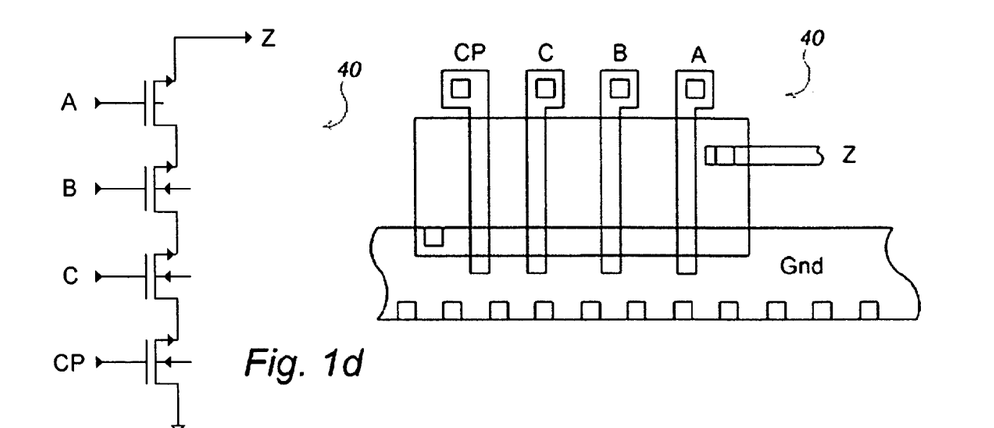

Although the circuits of FIGS. 1a–c, which are exemplary only, have a two input NAND logic function, logic circuits of other logic functions, sizes, and parametric characteristics may also be included in the library, if desired. For example, as shown in FIG. 1d, a three-input NAND gate embodiment 40 may be provided. Circuit embodiments having an OR functionality may also be provided, if desired. Furthermore, the library may contain circuits of particular custom physical architectures. As an example, the transistor 12 the circuit 10 of FIG. 1a is shown as having a length of 1.6 microns, to provide a tapered structure to the output to reduce its loading. The remaining transistors are shown having a length of 2 microns, illustrating the flexibility of the system.

Desirably, the set of circuits that are collected in the library contain most, if not all, of the parametric characteristics that will be needed in constructing the final library set from which the application circuits will be made. The library should also contain circuits having sufficient logic functionality to enable the particular logic functions to be used to be constructed. Typically, for example, a minimum library may contain a two-input NAND function and a two-input NOR function, since the logic circuits can be combined, as discussed below.

In addition to the library portion of logic circuits, according to a preferred embodiment of the invention, a library portion is provided having a set, family, or library of driver circuits. The driver circuit library is provided to enable a driver to be selected to match the characteristics of the selected logic circuit, for example, in respect to sizes, speeds, capacitances, loading characteristics, or other parametric characteristics. The driver circuits of FIGS. 2a–c are provided as an exemplar of a driver library that may be included. As with the logic circuit example of FIGS. 1a–d, various driver circuits are shown, the electrical schematic of which being shown on the left of the drawing and a corresponding representation of the layout of each circuit being shown on the right side of the drawing. The layout representations show features that are only of approximate relative size, and show the implant, poly-1, contact, and selected metal-1 layers. Those skilled in the art will recognize the existence of various oxide or isolation layers between the various features shown. Since a selected driver will be matched with a selected logic circuit, the driver circuits and logic circuits in each library should be designed with compatible manufacturing processes to enable them to be constructed as a part of the same integrated circuit.

Figure 2A:
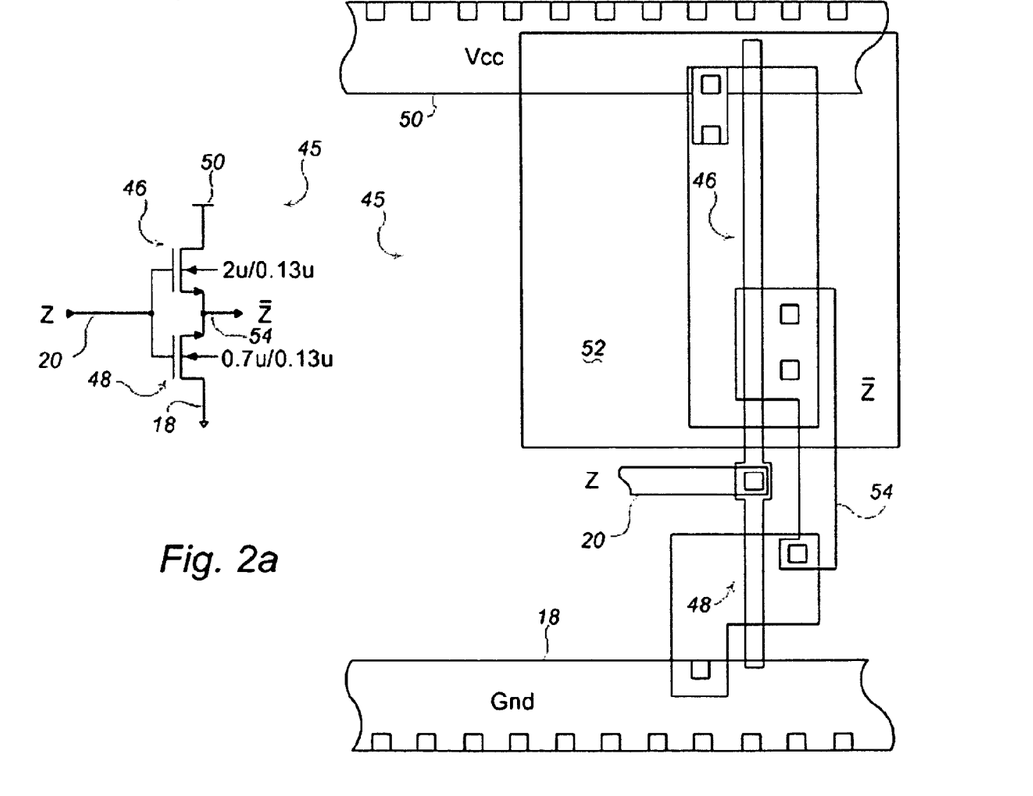
FIGS. 2a–c are circuit and layout diagrams of a library set of driver circuits that may be used in conjunction with selected logic circuits of FIGS. 1a–d in the construction of a library of domino circuits, in accordance with a preferred embodiment of the invention.

Thus, with reference now additionally to FIG. 2a, as an example, one circuit 45 that may be included in the library is an inverter having PMOS and NMOS transistors 46 and 48, connected between the supply rail, Vcc, 50, and the ground rail 18. The PMOS device 46 is formed in an n-well 52, and is of size, for example having a width-to-length (W/L) ratio of about 2 u/0.13 u. Only a single PMOS device structure is formed in the layout (as compared to the multiple device structures of the embodiments of FIGS. 2b and 2c). Similarly, the NMOS device 48, which is of much smaller size, for example, has a width-to-length (W/L) ratio of about 0.7 u/0.13 u.

The input on input line 20 is connected to the corresponding output line 20 from a selected one of the logic circuits of FIGS. 1a–d, and the inverted output is derived on output line 54. In the layout diagram, the metal-1 layers have been omitted for clarity, except for the input line 20 and output line 54. As mentioned above, the node 20 will serve as the dynamic node that will be precharged in the operation of the domino circuit in which the circuit 55 may be incorporated.

Figure 2B:
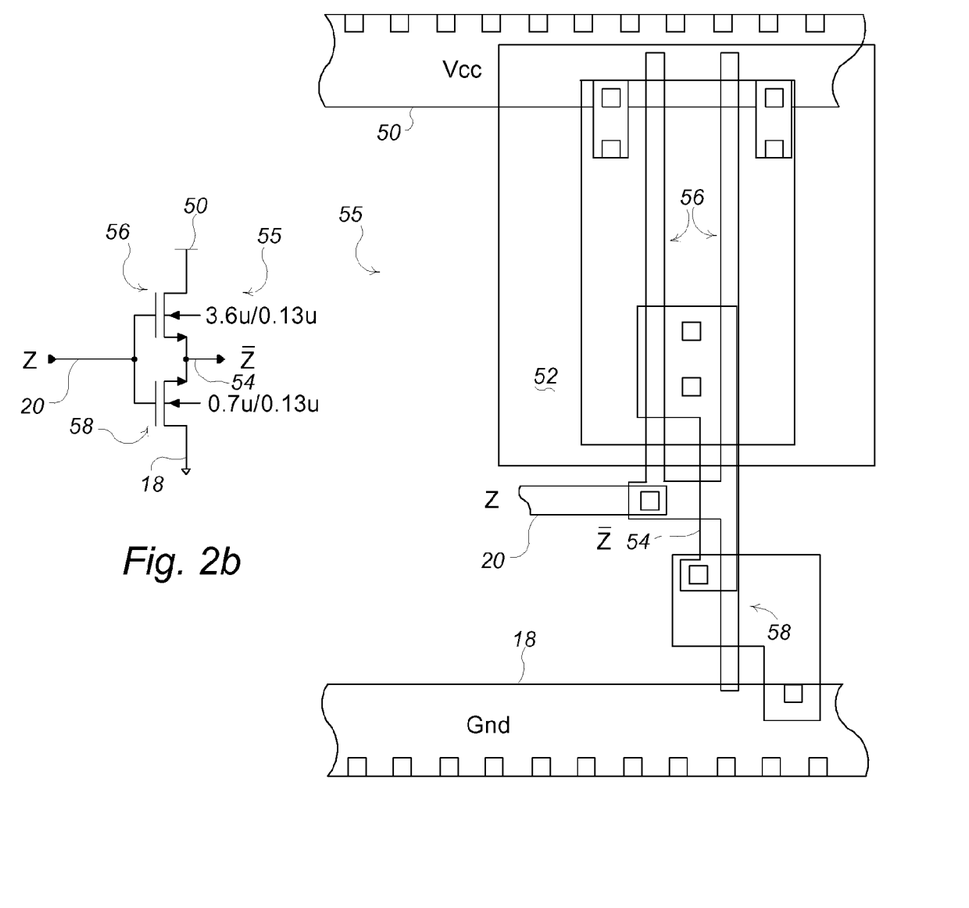

With reference now additionally to FIG. 2b, another example of an inverter circuit 55 that may be included in the library is shown. The inverter 55 has PMOS and NMOS transistors 56 and 58, connected between the supply rail, Vcc, 50, and the ground rail 18. The PMOS device 56 is formed in an n-well 52, and is of size, for example having a width-to-length (W/L) ratio of about 3.6 u/0.13 u. The width of the PMOS device is doubled using the two poly gate lines formed in the layout. Again, the NMOS device 58 is of much smaller size than the PMOS device, for example, having a width-to-length (W/L) ratio of about 0.7 u/0.13 u. This results in known transistor characteristics, notably the speed, capacitance, and drive capabilities of the devices, as well as other characteristics different from the circuit embodiment of FIG. 2a.

The input on input line 20 is connected to the corresponding output line 20 from a selected one of the logic circuits of FIGS. 1a–d, and the inverted output is derived on output line 54. In the layout diagram, the metal-1 layers have been omitted for clarity, except for the input line 20 and output line 54. As mentioned above, the node 20 will serve as the dynamic node that will be precharged in the operation of the domino circuit in which the circuit 55 may be incorporated.

Figure 2C:
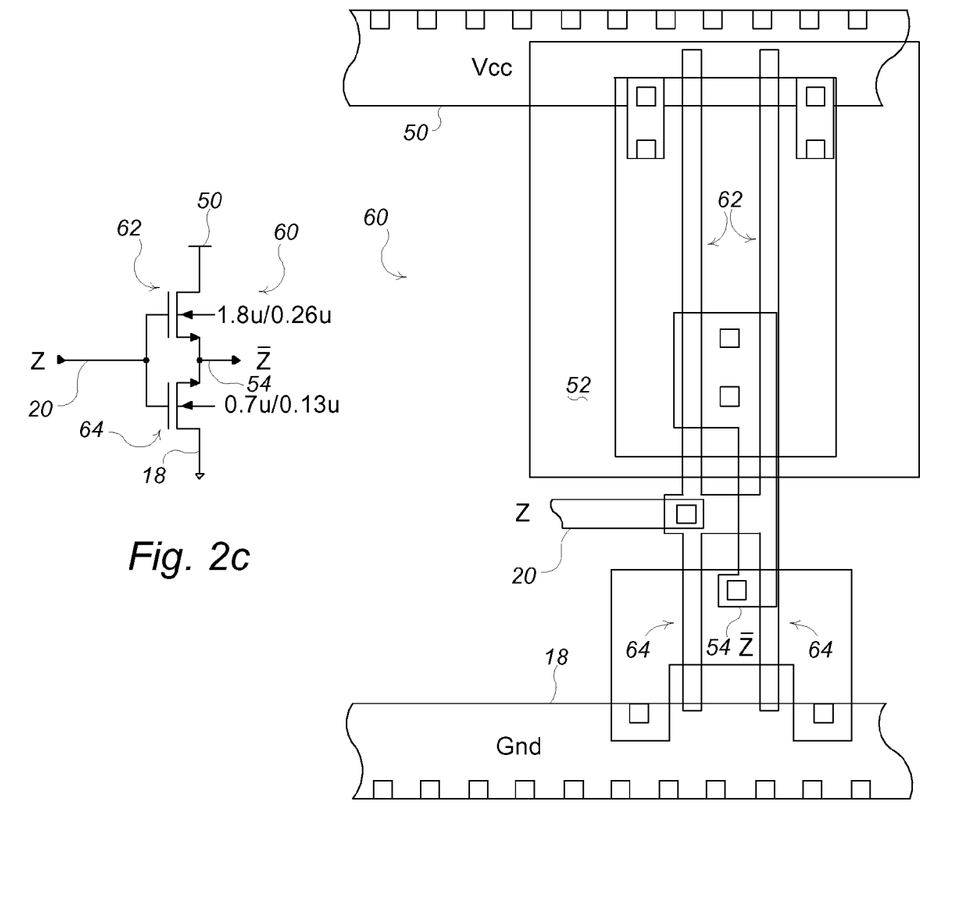

With reference now additionally to FIG. 2c, still another example of an inverter circuit 60 that may be included in the library is shown. The inverter 60 has PMOS and NMOS transistors 62 and 64, connected between the supply rail, Vcc, 50, and the ground rail 18. The PMOS device 62 is formed in an n-well 52, and is of size, for example having a width-to-length (W/L) ratio of about 1.8 u/0.26 u. The NMOS device 64 is of much larger size than the NMOS device 58 of FIG. 2b, for example, having a width-to-length (W/L) ratio of about 0.7 u/0.26 u. This results in known transistor characteristics, notably the speed, capacitance, and drive capabilities of the devices, as well as other characteristics different from the circuit embodiments of FIGS. 2a and 2b.

Again, the input on input line 20 is connected to the corresponding output line 20 from a selected one of the logic circuits of FIGS. 1a–d, and the inverted output is derived on output line 54. In the layout diagram, the metal-1 layers have been omitted for clarity, except for the input line 20 and output line 54. As mentioned above, the node 20 will serve as the dynamic node that will be precharged in the operation of the domino circuit in which the circuit 55 may be incorporated.

More particularly, in the design of typical domino circuits, the PMOS device of the driver is made very large and the NMOS device is made very small. However, Because the PMOS device is large, a large load can be driven, but it may load down the associated logic circuitry. So by having a family of sized devices available, a trade-off can be made to decrease the loading on the logic circuitry, and reduce the drive capacity of the PMOS device to optimize the speed of the circuit. So, if a very large load is needed to be driven, the size of the PMOS device can be selected to accommodate that as well. In sum, different sized PMOS devices are available for different loading situations. On the other hand, a smaller driver slows down the n-logic less, so if a larger driver at the output is not necessary to drive the load, a smaller PMOS device may be chosen.

In order to precharge the dynamic node 20 of the circuit that is constructed using elements of the library exemplified by FIGS. 1a–d and 2a–c, a standard PMOS precharge transistor may be used. The parametric characteristics of the PMOS transistor may depend upon the characteristics of the circuit components selected from the libraries. Thus, with reference additionally now to FIG. 3, a PMOS transistor 65 that can be used in conjunction with the circuit portions of FIGS. 1a–d and 2a–c is shown. The manufacturing processes by which the PMOS transistor is made should be compatible with the manufacturing processes of the circuits of the library portions with which it will be used to enable it to be constructed as a part of the same integrated circuit.

Figure 3:
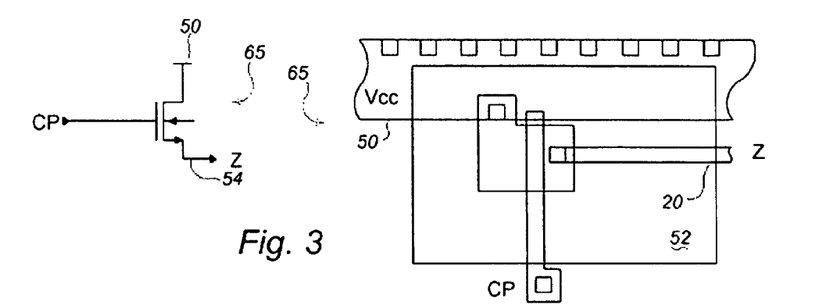
FIG. 3 is a circuit and layout diagram of PMOS precharge transistor that may be used in conjunction with the logic and driver circuits of FIGS. 1a–d and 2a–c, in accordance with a preferred embodiment of the invention.

The PMOS precharge transistor 65 has the clock input, CP, on its gate to conduct the supply voltage Vcc to the output line Z (the dynamic node), 20 when CP is low. In operation of the ultimate circuit, this will precharge the dynamic node 20 to enable domino operation. The PMOS transistor can be sized as needed, depending upon the particular circuit portions selected from the logic and driver circuit libraries. Various sized PMOS precharge transistors may be included as a part of the circuit libraries, if desired, or may be individually constructed for a particular circuit design as a standard transistor. Its size may be calculated, based upon known sizing parameters. Typically, in the construction of the standard cell libraries, a spot is left open during the initial design phases of the circuit, then a PMOS precharge transistor of predetermined size is inserted. Thus, if the drive PMOS transistor is small, the PMOS precharge transistor can also be made small, and vise versa.

If desired, keeper circuits may also be provided, for example, conveniently as a part of the logic circuit portion of the library. Usually a keeper circuit is desired in the design of a domino logic circuit; however, in some application, it may be desired to omit it. Consequently, the library may include some logic circuits having a keeper circuit, and some circuits in which the keeper is omitted. The example circuit of FIG. 4, to which reference is now additionally made shows a keeper circuit 70 associated with the logic circuit 30 of FIG. 1c.

Figure 4:
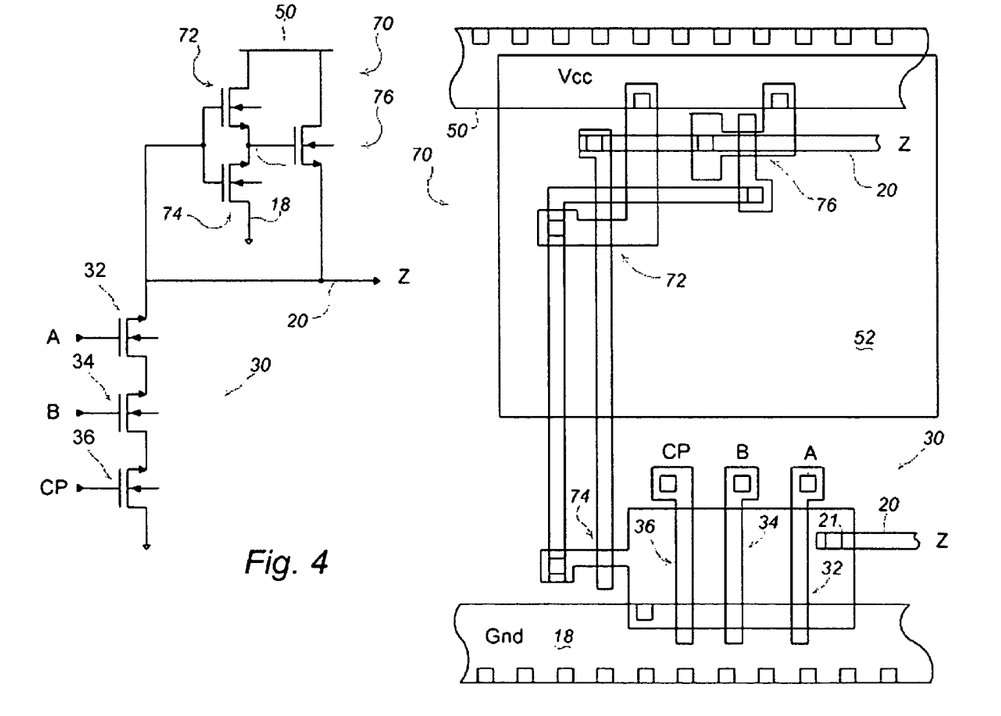
FIG. 4 is a circuit and layout diagram of an example of a keeper circuit used in conjunction with the logic circuit of FIG. 1c, in accordance with a preferred embodiment of the invention.

The keeper circuit 70 includes an inverter having a PMOS transistor 72 in series with an NMOS transistor 74 between the Vcc rail 50 and the ground rail 18. A weak PMOS transistor 76 is connected between the Vcc rail 50 and the dynamic node, Z, 20. The weak PMOS transistor 76 may be sized with a width-to-length (W/L) ratio of about 0.16 u/0.13 u, for example. As known, the weak PMOS transistor 76 serves to protect the dynamic node 20 from discharge that may be initiated by noise, current spikes, or the like.

In the layout of the keeper circuit, depending upon the size of the logic circuit with which it is associated, the location of the keeper circuit may need to be arranged to enable the insertion of the PMOS precharge transistor 65. As a result, various circuit arrangements may be provided in the library.

Figure 5:
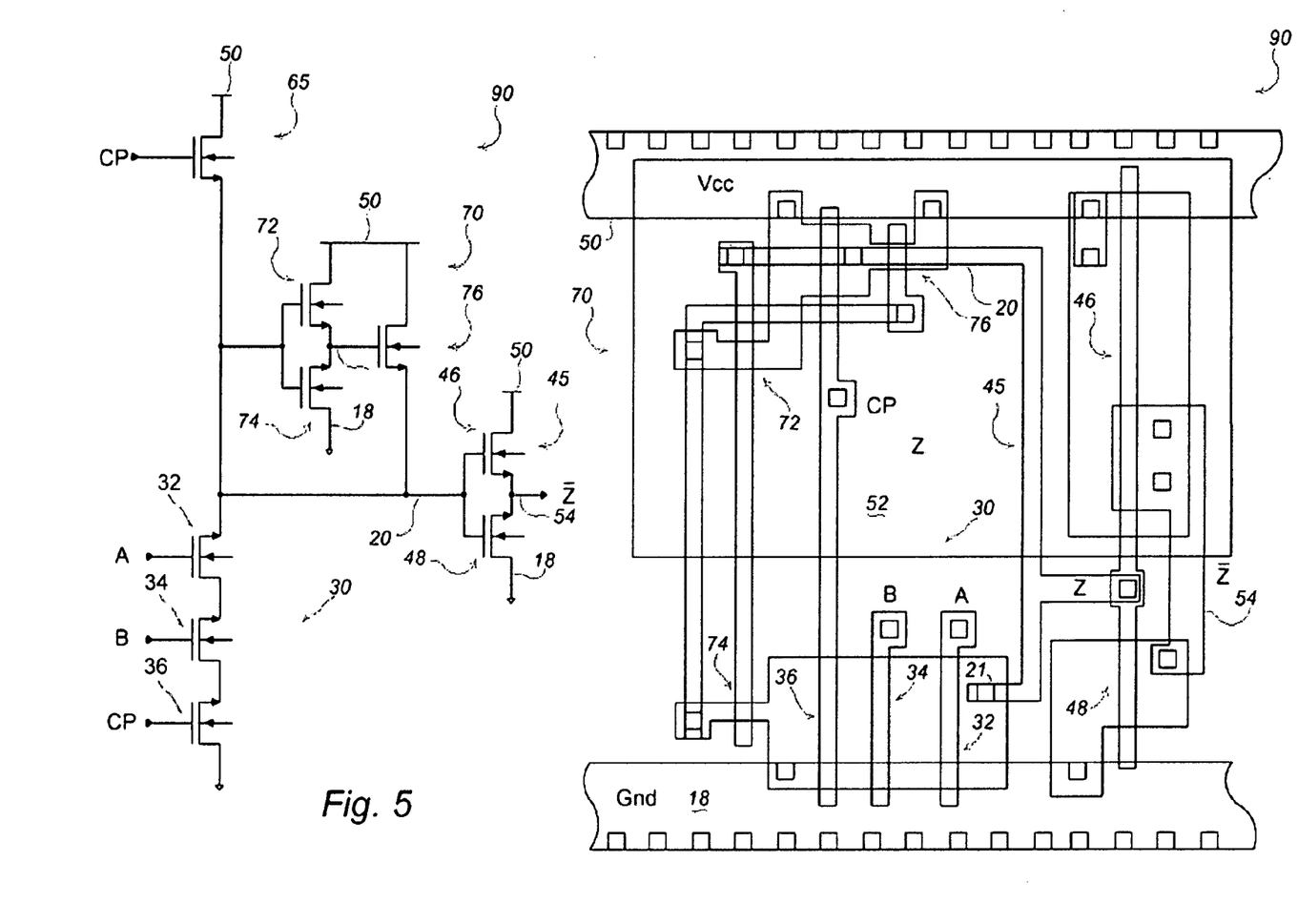
FIG. 5 is a circuit and layout diagram of an example circuit constructed using the library circuits of FIGS. 4, 2a, and 3, in accordance with a preferred embodiment of the invention.

In performing the method according to a preferred embodiment of the invention, a circuit library can be constructed from the various circuit library portions of FIGS. 1a–d, 2a–c, 3, and 4. For example, a circuit 90, shown in FIG. 5, to which reference is now additionally made, may be constructed from the circuits of FIGS. 4, 2a, and 3. The circuit 90 includes the logic portion 30, driver portion 45, precharge PMOS device 65, and keeper circuit 70, as described above. Through the selection of other combinations of the circuit library (only an exemplary portion of which being shown), other circuits can be designed having the logic function and parametric characteristics desired for a particular application. In the design of the final library, the various circuits may be manually constructed to form a library of cells. Then a synthesis tool may be used to construct the final circuit.

It should also be noted that in many circuit applications, the sizes of the various cells available in the library may be insufficient for the particular application needed. For example, if a logic function requiring an eight input AND gate is specified, the loading may be too much to maintain the desired speed or other circuit characteristic. Thus, it may be possible to provide two or more logic cells from the library, i.e., to split up the function among several logic cells. In that case, it may be necessary to provide driver circuits in the library that have multiple inputs, so that the driver circuit itself may perform a NAND or NOR function to achieve the ultimate desired logic result. For example, two 4-input NOR gate logic circuits may be used to provide an input to a 2-input NAND driver circuit.

Although the invention has been described and illustrated with a certain degree of particularity, it should be understood that the description contained herein is made only by way of example, and that numerous changes in the arrangement and combination of parts may be made without departing from the spirit and scope of the invention, as hereinafter claimed.

The invention claimed is:

1. A cell library for use in designing integrated domino circuits, comprising:
a first library portion including a plurality of FET logic circuits of first conductivity type to provide at least selectable transistor sizes;
and a second library portion including a plurality of selectable prechargeable complementary FET driver circuits, each configured to be connectable to an output of a selected one of said logic circuits, to provide at least selectable transistor sizes.

2. The library of claim 1 wherein said logic circuits are n-FET logic circuits.

3. The library of claim 1 wherein said logic circuits are p-FET logic circuits.

4. The library of claim 1 wherein said complementary FET driver circuits are CMOS driver circuits.

5. The library of claim 1 wherein said logic circuits are inverting logic circuits.

6. The library of claim 1 wherein said driver circuits have an inverting function.

7. The library of claim 6 wherein at least some of said driver circuits are inverters.

8. The library of claim 6 wherein at least some of said driver circuits comprise NOR gates.

9. The library of claim 6 wherein at least some of said driver circuits comprise NAND gates.

10. The library of claim 6 wherein at least some of said driver circuits are static driver circuits.

11. The library of claim 1 wherein said driver circuits are selectable to match at least a size characteristic of said selected one of said logic circuits.

12. The library of claim 1 further comprising at least selectable PMOS transistor connectable to said logic circuits to precharge elements thereof.

13. The library of claim 1 wherein said logic circuits further comprise a footer circuit to disconnect said selected logic circuit from a pull-down potential during a precharge clock phase.

14. The library of claim 1 further comprising a keeper circuit attached to an output of said logic circuit to hold a precharge voltage thereon.

15. The library of claim 1 wherein said MOS logic circuits are NMOS logic circuits.

16. A cell library for use in designing integrated circuits, comprising:
a first library portion containing a plurality of NMOS logic circuits to provide selectable logic functions and transistor sizes;
and a second library portion containing a plurality of selectable driver circuits, each configured to be connectable to an output of a selected one of said logic circuits, said driver circuits being selectable to match at least a size characteristic of said selected one of said logic circuits.

17. The library of claim 16 wherein said logic circuits are inverting logic circuits.

18. The library of claim 17 wherein said driver circuits have an inverting function.

19. The library of claim 18 wherein at least some of said driver circuits are inverters.

20. The library of claim 18 wherein at least same of said driver circuits comprise NOR gates.

21. The library of claim 18 wherein at least some of said driver circuits comprise NAND gates.

22. The library of claim 18 wherein at least some of said driver circuits are static driver circuits.

23. The library of claim 22 wherein at least some of said static driver circuits comprise a keeper circuit configured to hold a precharge value on an output of said logic circuit until an evaluate phase occurs.

24. The library of claim 16 further comprising at least selectable PMOS transistor connectable to said logic circuits to precharge elements thereof.

25. The library of claim 24 wherein said at least one PMOS transistor comprises a plurality of PMOS transistors of various selectable sizes.

26. The library of claim 16 further comprising a selectable latch circuit connectable to said selected logic circuit to selectively maintain a logic value contained in said selected logic circuit.

27. A cell library, comprising:
a first library portion comprising a plurality of selectable logic circuits with two or more logic functions; and
a second library portion comprising a plurality of selectable inverter circuits connectable to receive at least one output from a selected one of the selectable logic circuits, the selectable inverter circuits being selectable to match at least one parametric characteristic of the selected one of the selectable logic circuits.

28. The cell library of claim 27 wherein at least one of said inverter circuits has a plurality of inputs to which outputs of a corresponding plurality of said logic circuits are selectively connectable.

29. The cell library of claim 27 wherein at least one of said NMOS logic circuits has an "AND" function.

30. The cell library of claim 27 wherein at least one of said NMOS logic circuits has an "OR" function.

31. The cell library of claim 27 wherein at least one of said NMOS logic circuits has a complex logic function including both "AND" and "OR" functions.

32. The cell library of claim 27 wherein at least one of said inverter circuits is configured as a keeper circuit selectively connectable to said selected NMOS logic circuit.

33. The cell library of claim 32 wherein said keeper circuit comprises:
a pair of PMOS devices and an NMOS device,
said NMOS device and one of said PMOS devices being connected to form an inverter circuit connectable to an output of said NMOS logic circuit;
and another of said PMOS devices being connected to receive an output of said inverter circuit and connectable to said output of said NMOS logic circuit to latch an existing state therein.

34. The cell library of claim 27, wherein the selectable logic circuits each comprise a NMOS logic circuit or a FET logic circuit.

35. The cell library of claim 27, wherein at least two of the selectable logic circuits have differing transistor characteristics to provide selectable transistor characteristics.

36. The cell library of claim 35, wherein the differing transistor characteristics include transistor size.

37. The cell library of claim 27, wherein the at least one parametric characteristic of the selected one of the selectable logic circuits comprises transistor size.

* * * * *